US009906386B1

(12) United States Patent
Li et al.

(10) Patent No.: US 9,906,386 B1
(45) Date of Patent: Feb. 27, 2018

(54) FREQUENCY ESTIMATION, CORRECTION AND NOISE SUPPRESSION FOR MODEMS

(71) Applicant: Cypress Semiconductor Corporation, San Jose, CA (US)

(72) Inventors: Yan Li, Morganville, NJ (US); Wendy Yu, San Jose, CA (US); Kamesh Medapalli, San Jose, CA (US); Hongwei Kong, San Jose, CA (US); Patrick Cruise, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/630,106

(22) Filed: Jun. 22, 2017

Related U.S. Application Data

(60) Provisional application No. 62/446,085, filed on Jan. 13, 2017.

(51) Int. Cl.
*H03D 3/00* (2006.01)
*H04L 27/156* (2006.01)
*H04L 27/148* (2006.01)
*H03L 7/081* (2006.01)

(52) U.S. Cl.
CPC ........ *H04L 27/1566* (2013.01); *H04L 27/148* (2013.01); *H03L 7/081* (2013.01)

(58) Field of Classification Search
CPC .... H04L 27/1566; H04L 27/148; H03L 7/081
USPC .......................................................... 375/334
See application file for complete search history.

(56) References Cited

U.S. PATENT DOCUMENTS

| 4,485,347 | A | * | 11/1984 | Hirasawa | ............ | H04L 27/1566 |
| | | | | | | 329/303 |
| 4,716,376 | A | * | 12/1987 | Daudelin | .............. | H04L 25/069 |
| | | | | | | 329/300 |
| 4,825,452 | A | * | 4/1989 | Wong | .................. | H04L 27/1566 |
| | | | | | | 329/300 |
| 7,352,831 | B2 | | 4/2008 | Quinlan et al. | | |
| 7,405,613 | B2 | * | 7/2008 | De Ruijter | ............... | H03D 3/26 |
| | | | | | | 329/315 |
| 7,499,695 | B2 | * | 3/2009 | Subramanian | ....... | H04B 1/0003 |
| | | | | | | 375/324 |
| 8,311,082 | B2 | | 11/2012 | Pasternak et al. | | |
| 8,374,291 | B1 | | 2/2013 | Himsoon et al. | | |
| 8,629,716 | B2 | | 1/2014 | Han et al. | | |

(Continued)

FOREIGN PATENT DOCUMENTS

| CA | 2818517 A1 | 10/2002 |
| EP | 2833546 | 1/2016 |
| JP | 04198467 B2 | 12/2008 |

OTHER PUBLICATIONS

Virk, Kashif "Design of an Integrated GFSK Demodulator for a Bluetooth Receiver" Xilinkx, Mar. 30, 2001; 347 pages.

(Continued)

*Primary Examiner* — Helene Tayong

(57) ABSTRACT

A frequency-shift keying (FSK) demodulator includes a digital phase-locked loop (DPLL) based frequency estimator to convert a phase signal to a frequency signal, a frequency offset estimator to estimate and track direct current (DC) component of the frequency signal, and an average filter communicatively coupled to the frequency offset estimator to perform an accumulate-and-dump operation to improve a symbol-level signal to noise ratio (SNR) of the frequency signal.

17 Claims, 4 Drawing Sheets

(56) References Cited

U.S. PATENT DOCUMENTS

| | | | |
|---|---|---|---|
| 8,995,935 B2 | 3/2015 | Mihota | |
| 9,049,081 B2 | 6/2015 | Taniguchi et al. | |
| 9,077,435 B1 | 7/2015 | Rada et al. | |
| 9,106,485 B1* | 8/2015 | Waheed | H04W 4/008 |
| 9,497,055 B2 | 11/2016 | Xu et al. | |
| 2002/0122504 A1* | 9/2002 | Payne | H04L 25/061 375/317 |
| 2006/0062332 A1* | 3/2006 | Patra | H04L 27/2331 375/334 |
| 2006/0093079 A1* | 5/2006 | Kim | H04L 25/062 375/344 |
| 2010/0220780 A1* | 9/2010 | Peng | H04B 1/525 375/232 |
| 2011/0110465 A1* | 5/2011 | Shibata | H04L 27/142 375/317 |

OTHER PUBLICATIONS

International Search Report for International Application No. PCT/US17/61325 dated Dec. 15, 2017; 3 pages.
Written Opinion of the International Searching Authority for International Application No. PCT/US17/61325 dated Dec. 15, 2017; 7 pages.

* cited by examiner

FREQUENCY ESTIMATION, CORRECTION AND NOISE SUPPRESSION FOR MODEMS

CROSS-REFERENCE TO RELATED APPLICATIONS

The present application claims the benefit under 35 U.S.C. § 119(e) of U.S. Provisional Application Ser. No. 62/446,085, filed Jan. 13, 2017. Said U.S. Provisional Application Ser. No. 62/446,085 is hereby incorporated by reference in its entirety.

TECHNICAL FIELD

The present disclosure generally relates to the field of communication devices, and particularly to frequency modulation schemes utilized in communication devices.

BACKGROUND

A modem (modulator-demodulator) is a network device that modulates and demodulates signals to facilitate transmission of information. A modem may employ various types of frequency modulation scheme to implement modulation and demodulation. For instance, modems such as Bluetooth modems, ZigBee modems, Bluetooth Low Energy (BLE) modems and the like may employ a particular type of frequency modulation scheme called frequency-shift keying (FSK) modulation. FSK modulation may be configured to facilitate transmission of digital information through discrete frequency changes. It is noted, however, that FSK demodulation techniques currently available may not be able to satisfy some performance requirements.

SUMMARY

Embodiments of the present disclosure are directed toward a frequency-shift keying (FSK) demodulator having a digital phase-locked loop (DPLL) based frequency estimator to convert a phase signal to a frequency signal, a frequency offset estimator to estimate and track direct current (DC) component of the frequency signal, and an average filter communicatively coupled to the frequency offset estimator to perform an accumulate-and-dump operation to improve a symbol-level signal to noise ratio (SNR) of the frequency signal.

It is to be understood that both the foregoing general description and the following detailed description are for example and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
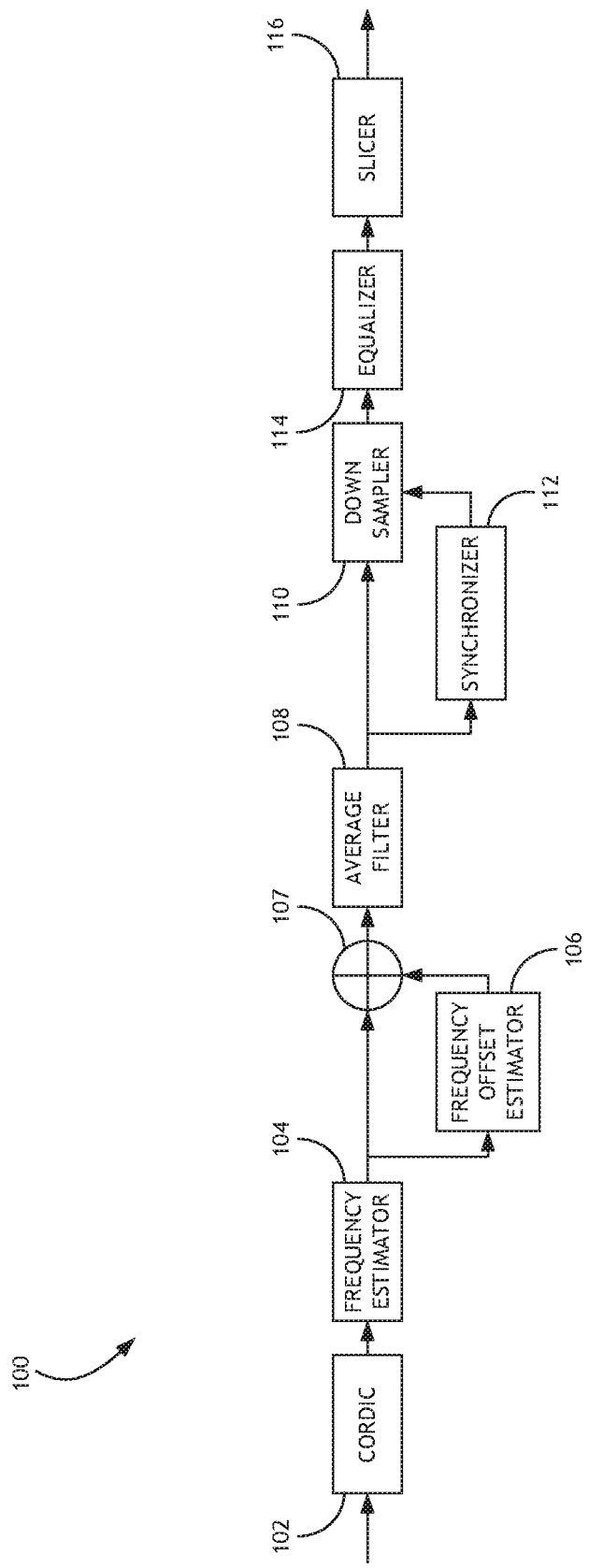
FIG. 1 is a simplified block diagram depicting a BLE demodulator.

Referring generally to FIG. 1, a simplified block diagram depicting a BLE demodulator 100 is shown. It is noted that since BLE demodulators are well understood by those skilled in the art, detailed descriptions of each component of the BLE demodulator 100 depicted in FIG. 1 are not repeated in the present disclosure. Generally, the BLE demodulator 100 may include a Cartesian coordinate-to-phase converter 102 configured to convert over-sampled IQ data into phases. A frequency estimator 104 may then convert the phase signal into a frequency signal. A frequency offset estimator 106 may be utilized to estimate and track a direct current (DC) component of the frequency signal due to carrier frequency offset and/or clock drift. An average filter 108 and a down sampler 110 may then jointly perform an accumulate-and-dump or integrate-and-dump operation to collect more energy from an over-sampled signal by accumulating the sums of frequency estimates and offset estimates from a summation component 107, and suppress the noise to improve the symbol-level signal-to-noise ratio (SNR); the accumulated values are dumped to an equalizer 114. In some embodiments, a synchronizer 112 may be utilized to search the access code of the BLE packet and find the best timing for the down sampler 110. The equalizer 114 may be configured to remove the frequency-domain inter-symbol-interference (ISI) for the information transferred via the demodulated signal. A slicer 116 may convert the equalized symbols representing the information into bits in order to complete the demodulation process.

It is noted that current implementations of BLE demodulators exhibit several issues. For instance, because frequency estimators 104 are typically implemented as phase differentiators, they are sensitive to phase estimation errors. Additionally, accuracies of currently available implementations of frequency offset estimators 106 are limited. Furthermore, current implementations of average filters 108 may introduce ISI that cannot be removed from preambles and access addresses of BLE packets. This extra ISI may deteriorate the detection performance of preamble and access code, negatively affecting the performance of the BLE demodulator 100.

Figure 2:
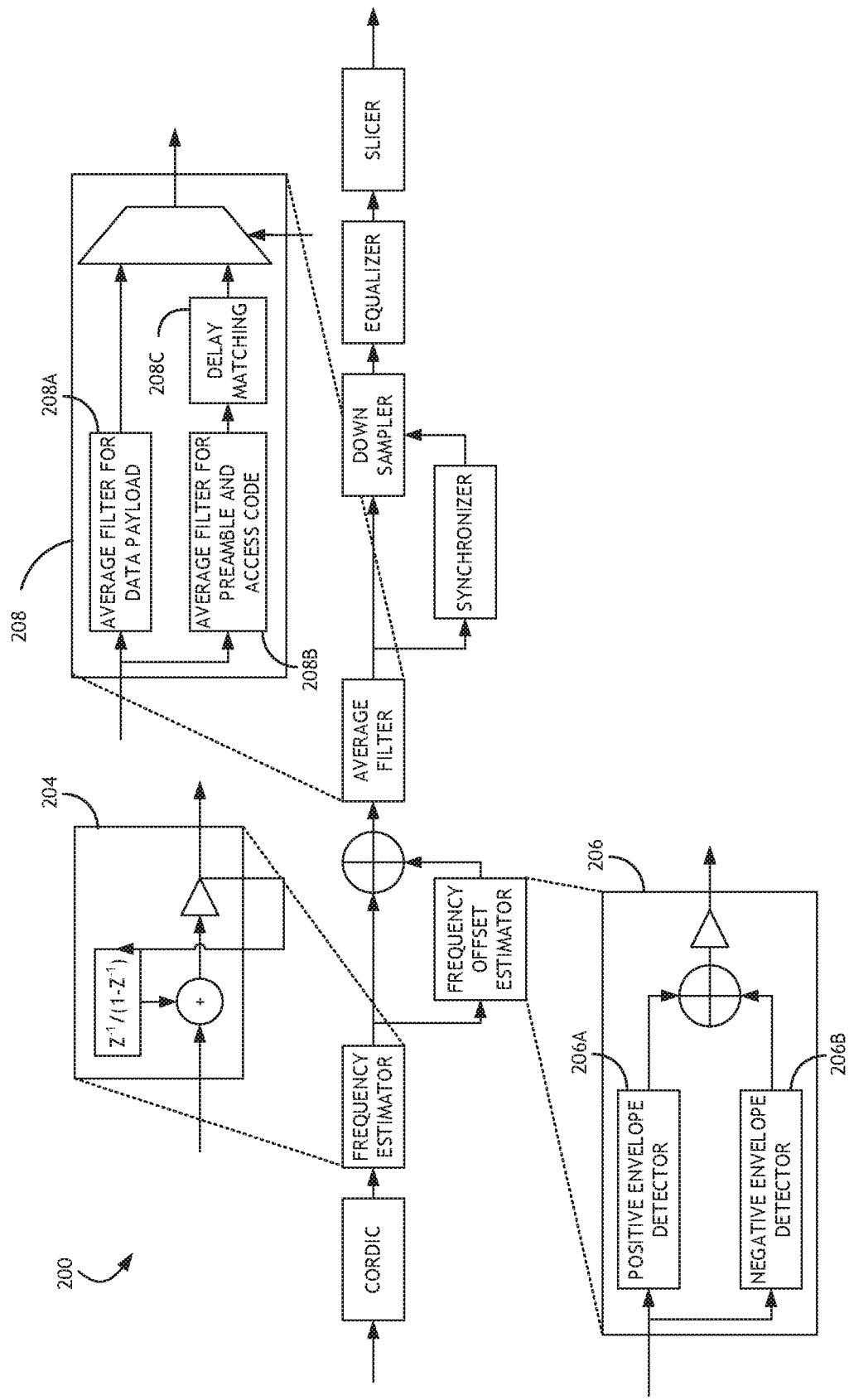
FIG. 2 is a simplified block diagram depicting a BLE demodulator configured in accordance with an embodiment of the present disclosure.

FIG. 2 is a simplified block diagram depicting a BLE demodulator 200 configured in accordance with some embodiments of the present disclosure. As shown in FIG. 2, the frequency estimator may be implemented as a digital phase-locked loop (DPLL) based frequency estimator 204. In some embodiments, the transfer function of the DPLL may be defined as $$\frac{Y(z)}{X(z)} = \frac{K(1-z^{-1})}{1-(1-K)z^{-1}}.$$

In this manner, the DPLL based frequency estimator 204 may be configured to function as a phase differentiator by setting K=1 (i.e., setting the transfer function to $1-z^{-1}$). Alternatively, the DPLL based frequency estimator 204 may be configured to provide some flexibility to the DPLL bandwidth by fine-tuning (adjusting) the value of the variable K (amplifier gain) to improve the frequency estimation accuracy.

Additionally, as shown in FIG. 2, the frequency offset estimator may be implemented utilizing an envelope tracker 206 to help track positive and negative envelopes of the frequency signal. The envelope tracker 206 may be implemented as a circuit comprising a positive envelope detector 206A and a negative envelope detector 206B; each envelope detector 206A, 206B takes a high-frequency signal as input and provides an output which is the positive side envelope of the original signal in the case of the positive envelope detector 206A, and the negative side envelope of the original signal in the case of the negative envelope detector 206B. The outputs may then be summed and amplified. The envelopes may be utilized to facilitate the estimation of the frequency offset. In some embodiments, the envelope tracker 206 may be configured to support at least an acquisition mode and a tracking mode. In some embodiments, the envelopes may be lightly filtered in the acquisition mode and heavily filtered in the tracking mode. In some embodiments, the frequency offset may be estimated as:

$$w_1 \frac{PosEnv \text{ in acquisition mode} - NegEnv \text{ in acquisition mode}}{2} + w_2 \frac{PosEnv \text{ in tracking mode} - NegEnv \text{ in tracking mode}}{2}$$

Where $w_1$ and $w_2$ are weights for the acquisition mode and the tracking mode, respectively, and where $w_1+w_2=1$. In some embodiments, the receiver may initially set a higher weight on $w_1$. Upon completion of synchronization, the receiver may reduce the weight on $w_1$ and increase the weight on $w_2$ (i.e., relying more on tracking mode results). It is contemplated that configuring the envelope tracker 206 in this manner may allow the filtering process to be applied more directly on the frequency extrema, which may suppress noises more efficiently.

Furthermore, as shown in FIG. 2, two separate average filters 208A and 208B may be utilized to facilitate data demodulation and synchronization. It is contemplated that using two separate average filters 208A and 208B may help reduce ISI. For instance, in some embodiments, a first average filter 208A may be configured specifically for data demodulation. This average filter 208A may be implemented in manners similar to the average filter 108 used in conventional BLE demodulators, meaning that the accumulation length of this average filter 208A may be configured to be the same as the symbol duration as defined by the symbol changes, waveform changes, or other signaling events.

A second average filter 208B may be configured to have a shorter accumulation length and hence a reduced ISI. The second average filter 208B may be utilized specifically for synchronization. In some embodiments, the second average filter 208B may operate specifically on preambles and access addresses of the received packets to complete synchronization. Upon completion of synchronization, the first average filter 208A may be engaged to perform data equalization and demodulation.

It is contemplated that the accumulation length of the second average filter 208B may be chosen based on various factors. For instance, if the accumulation length is set to one, the second average filter 208B may have the least ISI but potentially worse SNR. Increasing the accumulation length may increase ISI but reduce SNR. It is therefore contemplated that the accumulation length of the second average filter 208B may be chosen as a tradeoff between SNR and ISI. It is to be understood that the accumulation length of the second average filter 208B may vary without departing from the spirit and scope of the present disclosure.

In some embodiments, a delay matching block 208C is utilized to align the timing of two average filters. In this manner, the timing acquired by the second average filter 208B may be applied directly to data demodulation performed by the first average filter 208A.

The DPLL based frequency estimator 204, configured in accordance with embodiments of the present disclosure, can provide the flexibility to adjust the DPLL bandwidth to improve the accuracy of frequency estimation. Additionally, using the envelope tracker 206 as a frequency offset estimator allows filtering to be applied directly on the frequency extrema, making the frequency offset estimator more efficient in suppressing noises. Furthermore, using two separate average filters 208A and 208B for data demodulation and synchronization can help reduce ISI that negatively affects the performance of the BLE demodulator 200.

It is to be understood that while the BLE demodulator 200 is shown to have implemented a combination of the DPLL based frequency estimator 204, the envelope tracker 206, and the two separate average filters 208A and 208B, this combination is not required. It is contemplated that a BLE demodulator configured in accordance with the present disclosure may implement any one or any combinations of the DPLL based frequency estimator 204, the envelope tracker 206, and the two separate average filters 208A and 208B described above without departing from the spirit and scope of the present disclosure.

It is also to be understood that while the descriptions above made specific references to BLE demodulators, such references are made merely for illustrative purposes and are not meant to be limiting. It is contemplated that the DPLL based frequency estimator 204, the envelope tracker 206, and the two separate average filters 208A and 208B described above may be utilized in various types of FSK demodulators without departing from the spirit and scope of the present disclosure; for example, a continuous-phase FSK demodulator, Gaussian FSK demodulator, minimum FSK (or MSK) demodulator, or any demodulator utilizing FSK.

Figure 3:
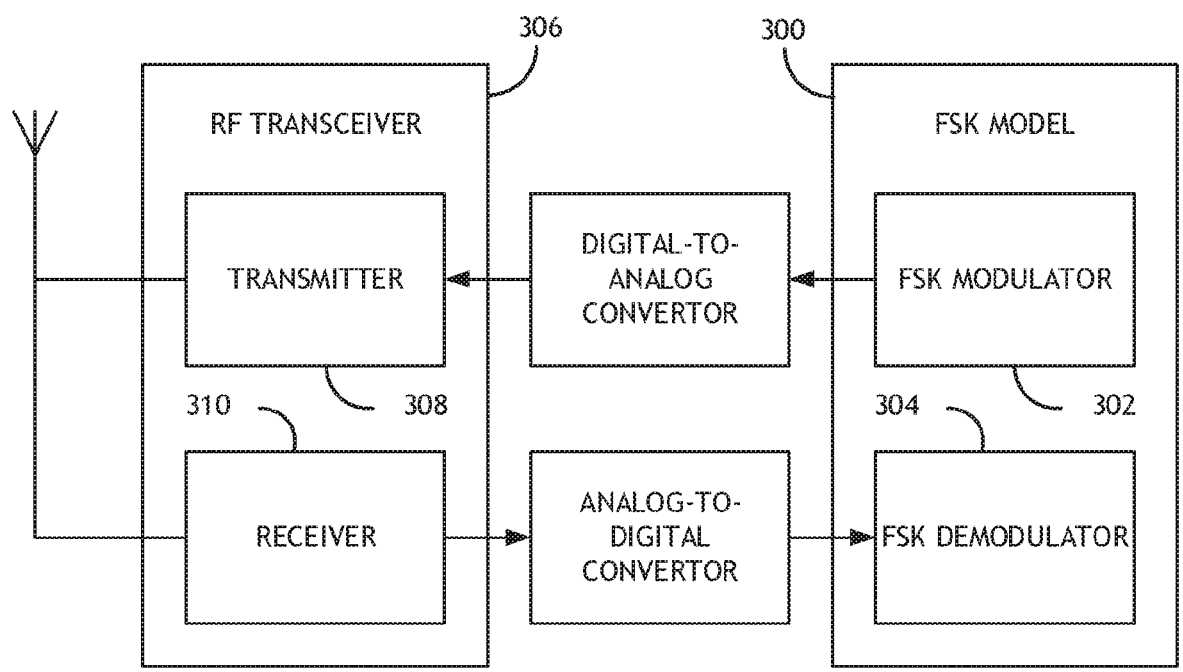
FIG. 3 is a block diagram depicting a modem equipped with an FSK demodulator configured in accordance with an embodiment of the present disclosure.

Referring now to FIG. 3, a block diagram depicting a modem 300 equipped with an FSK demodulator configured in accordance with an embodiment of the present disclosure is shown. More specifically, the modem 300 may include an FSK modulator 302 and an FSK demodulator 304. Both the FSK modulator 302 and the FSK demodulator 304 may be implemented as a hardware component of the modem 300. In some embodiments, the modem 300 may be implemented as an application-specific integrated circuit (ASIC), a part of which may include the various components depicted in FIG. 2 that form the FSK demodulator 304. It is noted that since FSK modulators are well understood by those skilled in the art, detailed descriptions of FSK modulators are not repeated in the present disclosure.

Also shown in FIG. 3 is a radio frequency (RF) transceiver 306 communicative coupled with the modem 300. The RF transceiver 306 may include a transmitter 308 and a receiver 310. The transmitter 308 may be configured to transmit signals provided by the FSK modulator 302 to external devices. The receiver 310, on the other hand, may be configured to receive signals form external devices and provide the received signals to FSK demodulator 304 for processing. It is contemplated that the FSK demodulator 304 may be configured to process the received signal as described above.

Figure 4:
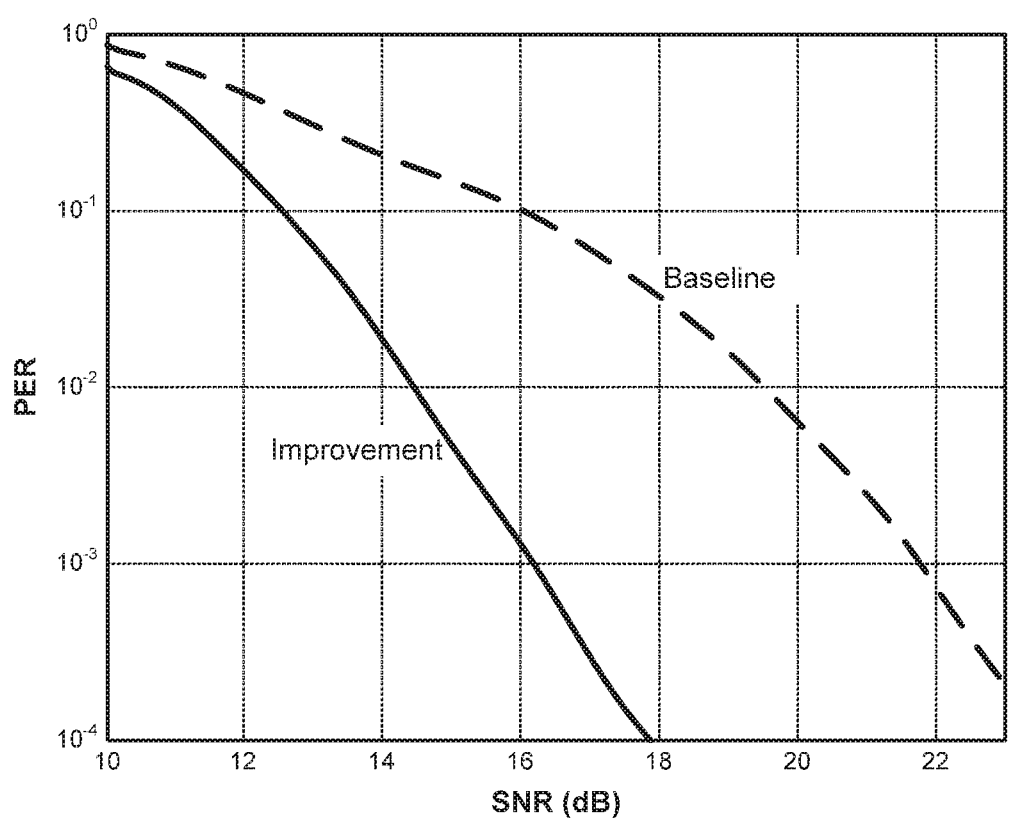
FIG. 4 is a diagram depicting experiment data illustrating the effectiveness of an FSK demodulator configured in accordance with an embodiment of the present disclosure.

FIG. 4 is a diagram depicting experiment data that illustrates the effectiveness of the FSK demodulator 304. Compared to the baseline established using conventional implementations, FSK demodulators configured in accordance with the present disclosure achieved ~1.7 dB improvement at 30% packet error ratio (PER) and ~3.3 dB improvement at 10% packet error ratio (PER) for payload length of 37 bytes.

It is believed that the systems and devices disclosed herein and many of their attendant advantages will be understood by the foregoing description, and it will be apparent that various changes may be made in the form, construction, and arrangement of the components thereof without departing from the broad scope of the present disclosure or without sacrificing all of their material advantages. The form herein before described being merely an explanatory embodiment thereof, it is the intention of the following claims to encompass and include such changes.

The above description is intended to be illustrative, and not restrictive. For example, the above-described embodiments (or one or more aspects thereof) may be used in combination with each other. Other embodiments will be apparent to those of skill in the art upon reviewing the above description. In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. In the event of inconsistent usages between this document and those documents so incorporated by reference, the usage in the incorporated reference(s) should be considered supplementary to that of this document; for irreconcilable inconsistencies, the usage in this document supersedes the usage in any incorporated references.

Although the claimed subject matter has been described with reference to specific embodiments, it will be evident that various modifications and changes may be made to these embodiments without departing from the broader spirit and scope of what is claimed. Accordingly, the specification and drawings are to be regarded in an illustrative rather than a restrictive sense. The scope of the claims should be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended; a system, device, article, or process that includes elements in addition to those listed after such a term in a claim are still deemed to fall within the scope of that claim. Moreover, in the following claims, the terms "first," "second," and "third," etc. are used merely as labels and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims.

What is claimed is:

1. A frequency-shift keying (FSK) demodulator, comprising:
   a digital phase-locked loop (DPLL) based frequency estimator that converts a phase signal to a frequency signal;
   a frequency offset estimator communicatively coupled to the DPLL based frequency estimator, the frequency offset estimator that estimated and track direct current (DC) component of the frequency signal;
   an average filter communicatively coupled to the frequency offset estimator, the average filter performing an accumulate-and-dump operation; and
   a slicer communicatively coupled to the average filter that outputs demodulated bits.

2. The FSK demodulator of claim 1, wherein the frequency offset estimator comprises one or more envelope detectors.

3. The FSK demodulator of claim 2, wherein the one or more envelope detectors implement at least an acquisition mode and a tracking mode.

4. The FSK demodulator of claim 3, wherein the acquisition mode is assigned a first weight and the tracking mode is assigned a second weight, wherein the first weight is initially set to be greater than the second weight, and where upon completion of synchronization, the first weight is reduced to be lower than the second weight.

5. The FSK demodulator of claim 1, wherein the average filter comprises a first average filter and a second average filter separate from the first average filter.

6. The FSK demodulator of claim 5, wherein the first average filter has a first accumulation length that corresponds to symbol duration of data being demodulated.

7. The FSK demodulator of claim 6, wherein the second average filter has a second accumulation length that is shorter than the first accumulation length of the first average filter.

8. The FSK demodulator of claim 7, wherein the second average filter operated on preambles and access addresses of packets received to complete synchronization, and wherein upon completion of synchronization, the first average filter performs data equalization and demodulation.

9. The FSK demodulator of claim 1, wherein the DPLL based frequency estimator defines a transfer function that operates as a phase differentiator.

10. The FSK demodulator of claim 9, wherein the transfer function implements flexible bandwidth in the DPLL based frequency estimator by adjusting a variable in the transfer function.

11. The FSK demodulator of claim 1, wherein the FSK demodulator is a Bluetooth demodulator or a Bluetooth Low Energy (BLE) demodulator.

12. A frequency-shift keying (FSK) demodulator, comprising:
   a digital phase-locked loop (DPLL) based frequency estimator that converts a phase signal to a frequency signal;
   a frequency offset estimator communicatively coupled to the DPLL based frequency estimator, the frequency offset estimator comprising one or more envelope detectors that estimate and track direct current (DC) component of the frequency signal;
   an average filter communicatively coupled to the frequency offset estimator, the average filter performing an accumulate-and-dump operation; and
   a slicer communicatively coupled to the average filter that outputs demodulated bits.

13. The FSK demodulator of claim 12, wherein the one or more envelope detectors comprise a positive envelope detector and a negative envelope detector, the positive envelope detector and negative envelope detector implementing at least an acquisition mode and a tracking mode.

14. The FSK demodulator of claim 13, wherein the acquisition mode is assigned a first weight and the tracking mode is assigned a second weight, wherein the first weight is initially set to be greater than the second weight, and where upon completion of synchronization, the first weight is reduced to be lower than the second weight.

15. The FSK demodulator of claim 12, wherein the average filter comprises a first average filter and a second average filter separate from the first average filter, wherein the first average filter has a first accumulation length that corresponds to symbol duration of data being demodulated, and wherein the second average filter has a second accumulation length that is shorter than the first accumulation length of the first average filter.

16. The FSK demodulator of claim 15, wherein the second average filter operates on preambles and access addresses of packets received to complete synchronization, and wherein upon completion of synchronization, the first average filter performs data equalization and demodulation.

17. The FSK demodulator of claim 12, wherein the DPLL based frequency estimator defines a transfer function that functions as a phase differentiator, and wherein the transfer function implements flexible bandwidth in the DPLL based frequency estimator by adjusting a variable in the transfer function.

\* \* \* \* \*